US010883167B2

(12) United States Patent
Zhao et al.

(10) Patent No.: US 10,883,167 B2
(45) Date of Patent: Jan. 5, 2021

(54) CRUCIBLE, EVAPORATION SOURCE AND EVAPORATION DEVICE

(71) Applicant: BOE TECHNOLOGY GROUP CO., LTD., Beijing (CN)

(72) Inventors: Dejiang Zhao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 261 days.

(21) Appl. No.: 15/983,071

(22) Filed: May 17, 2018

(65) Prior Publication Data

US 2019/0003035 A1 Jan. 3, 2019

(30) Foreign Application Priority Data

Jul. 3, 2017 (CN) .................... 2017 2 0793045 U

(51) Int. Cl.
| C23C 14/24 | (2006.01) |
| F27B 14/12 | (2006.01) |
| F27B 14/06 | (2006.01) |
| C23C 14/54 | (2006.01) |
| F27B 14/10 | (2006.01) |
| F27B 14/08 | (2006.01) |

(52) U.S. Cl.
CPC .......... *C23C 14/243* (2013.01); *C23C 14/542* (2013.01); *F27B 14/06* (2013.01); *F27B 14/12* (2013.01); *F27B 2014/0843* (2013.01); *F27B 2014/102* (2013.01)

(58) Field of Classification Search
CPC ..... C23C 14/243; C23C 14/542; F27B 14/06; F27B 14/10; F27B 14/12
USPC ........................................................ 118/726
See application file for complete search history.

(56) References Cited

U.S. PATENT DOCUMENTS

2012/0012050 A1* 1/2012 Pei ........................... C23C 4/12
118/47

FOREIGN PATENT DOCUMENTS

| CN | 202786404 | * | 3/2013 |
| CN | 104357797 | * | 2/2015 |

OTHER PUBLICATIONS

CN104357797 machine translation (Year: 2015).*
CN202786404 machine translation (Year: 2013).*

* cited by examiner

*Primary Examiner* — Elizabeth A Burkhart
(74) *Attorney, Agent, or Firm* — Kinney & Lange, P.A.

(57) ABSTRACT

A crucible, an evaporation source and an evaporation device are disclosed. The crucible includes a crucible body. The crucible body includes: an inner heating layer with a first heater assembly and an outer heating layer with a second heater assembly. The outer heating layer is at a periphery of the inner heating layer, and surrounds the inner heating layer, and a space between the outer heating layer and the inner heating layer defines an accommodation space for a to-be-evaporated material.

18 Claims, 4 Drawing Sheets

CRUCIBLE, EVAPORATION SOURCE AND EVAPORATION DEVICE

CROSS-REFERENCE TO RELATED APPLICATION

This application is based on and claims the priority of the Chinese patent application No. 201720793045.8 filed on Jul. 3, 2017, which is incorporated herein by reference in its entirety.

TECHNICAL FIELD

The present disclosure relates to the field of the display panel manufacturing technology, and in particular to a crucible, an evaporation source and an evaporation device.

BACKGROUND

With development of technology, the production process of organic light emitting diode (OLED) display devices is becoming more and more mature. The production process of OLED components mainly includes a vacuum evaporation, spin coating, inkjet printing, etc. The vacuum evaporation is a more mature method and has been used in mass production.

Currently, when the OLED components are manufactured by means of vacuum evaporation, a point evaporation source is usually adopted. When the point evaporation source is adopted in the vacuum evaporation, as an evaporation material in a crucible is continuously reduced, a heating area of the evaporation material is also gradually reduced. In order to ensure that the evaporation material is evaporated at an identical evaporation rate, the temperature of the crucible is increased continuously. However, as the temperature of the crucible is increased continuously, properties of the evaporation material in the crucible may be changed, and performance of the final OLED components may be adversely affected.

SUMMARY

One embodiment of the present disclosure provides a crucible which includes a crucible body. The crucible body includes: an inner heating layer with a first heater assembly and an outer heating layer with a second heater assembly. The outer heating layer is at a periphery of the inner heating layer, and surrounds the inner heating layer, and a space between the outer heating layer and the inner heating layer defines an accommodation space for a to-be-evaporated material.

Optionally, the crucible body includes an opening in a first end surface of the crucible body for evaporated material of the to-be-evaporated material to escape from the crucible body; the inner heating layer extends from a second end surface opposite to the first end surface towards the first end surface; and an end of the inner heating layer away from the second end surface is spaced from the first end surface.

Optionally, the crucible body further includes a housing having an inner chamber; the outer heating layer is connected with the housing; and the inner heating layer is at a central position of the inner chamber.

Optionally, the outer heating layer is in the inner chamber, mounted to an inner wall of the housing and surrounds the inner heating layer.

Optionally, the second heater assembly of the outer heating layer includes a first heater and a second heater spaced from the first heater; the first heater and the second heater are arranged sequentially in a direction from the second end surface to the first end surface.

Optionally, each of the first heater and the second heater is a heating wire that is wound around the inner heating layer with the inner heating layer as a center.

Optionally, the first heater and the second heater are independently controlled.

Optionally, the first heater assembly of the inner heating layer includes a third heater and a fourth heater separated from the third heater; the third heater and the fourth heater are arranged sequentially in a direction from the second end surface to the first end surface.

Optionally, each of the third heater and the fourth heater has a cylindrical shape.

Optionally, the third heater and the fourth heater are independently controlled.

Optionally, the crucible further includes a guide cover and a linkage structure. The guide cover includes several blades; the guide cover has a first state and a second state; at the first state, the blades are folded and stacked in the space between the inner heating layer and the first end surface, and an airflow path is defined between the accommodation space and the opening; at the second state, the blades are unfolded within the crucible body and blocks a part of the airflow path. The linkage structure is connected with the guide cover; and the linkage structure drives the guide cover to switch between the first state and the second state.

Optionally, the unfolded blades are in an identical plane within the crucible body with an interval defined between adjacent blades.

Optionally, an outer periphery of each blade at the unfolded state abuts against the inner wall of the housing of the crucible body.

Optionally, the linkage structure includes: a blade seat between the inner heating layer and the first end surface; a shaft fixed to the blade seat and extending towards the first end surface; a shaft sleeve disposed around the shaft and movable relative to the shaft in a direction towards or away from the first end surface, where the shaft sleeve is connected with each blade, and the blades are driven by the shaft sleeve to move in a direction towards or away from the first end surface, thereby enabling the guide cover to switch between the first state and the second state; and a driving member connected with the shaft sleeve. The driving member drives the shaft sleeve to move relative to the shaft in the direction towards or away from the first end surface.

Optionally, the blade seat is disposed on an end of the inner heating layer away from the second end surface.

Optionally, each blade is pivotally connected to the shaft sleeve.

Optionally, the driving member includes a pneumatic driver or a hydraulic driver.

Optionally, the linkage structure further includes a blocking bar on the blade seat with an inserting space defined between the blocking bars and the blade seat. Each blade is inserted into the inserting space when the guide cover switches between the first state and the second state.

One embodiment of the present disclosure further provides an evaporation source including the above crucible.

One embodiment of the present disclosure further provides an evaporation device including the above evaporation source.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of devices and methods consistent with aspects related to the disclosure as recited in the appended claims.

Figure 1:
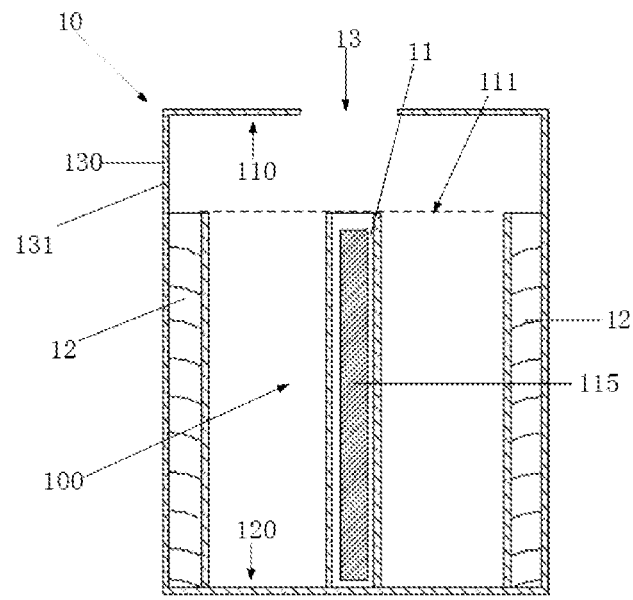
FIG. 1 is a schematic cross-sectional view of a crucible according to an exemplary embodiment of the present disclosure.

FIG. 1 is a schematic cross-sectional view of a crucible according to an exemplary embodiment of the present disclosure. Referring to FIG. 1, the crucible includes a crucible body 10. The crucible body 10 includes an inner heating layer 11 and an outer heating layer 12. Each of the inner heating layer 11 and the outer heating layer 12 is provided with a heater assembly. The outer heating layer 12 is at a periphery of the inner heating layer 11, and surrounds the inner heating layer 11. A space between the outer heating layer 12 and the inner heating layer 11 defines an accommodation space 100 for a to-be-evaporated material.

In the crucible of one embodiment of the present disclosure, two heating layers including the inner heating layer and the outer heating layer are provided and may be controlled separately. Then, in the evaporation process, by controlling on or off of the two heating layers, a heating area for an evaporation material is changed, thereby achieving the purpose of controlling an evaporation rate of the evaporation material in the crucible and then solving the problem that the crucible in the related art is integrated with only one heating portion and has to improve heating power to adjust the evaporation rate when there is less material in the crucible, thereby causing properties of the evaporation material to be changed.

Referring to FIG. 1, in one embodiment, the crucible body 10 includes a housing 130 defining an inner chamber. The inner heating layer 11 is disposed in a central position of the inner chamber. The outer heating layer 12 is in contact with the housing 130, and surrounds the inner heating layer 11. The inner chamber of the housing 130 and the space between the outer heating layer 12 and the inner heating layer 11 define the accommodation space 100 for accommodating the to-be-evaporated material. In one embodiment, the outer heating layer 12 is disposed in the inner chamber, mounted to an inner wall of the housing 130 and surrounds the inner heating layer 11.

Specifically, the housing 130 of the crucible body 10 includes a first end surface 110 (i.e., a top end surface when the crucible body 10 is at a position shown in FIG. 1) and a second end surface 120 (i.e., a bottom end surface when the crucible body 10 is at a position shown in FIG. 1) opposite to the first end surface 110. An opening 13 is defined in the first end surface 110 and in communication with the accommodation space 100. When the to-be-evaporated material is evaporated, the evaporated material escapes from the crucible body 10 through the opening 13. Within the housing 130, the inner heating layer 11 extends from the second end surface 120 towards the first end surface 110 with a preset distance defined between the first end surface 110 and an end (i.e., a top end of the inner heating layer 11 when the crucible body 10 is at a position shown in FIG. 1) of the inner heating layer 11 away from the second end surface 120. Based on this, the inner heating layer 11 is disposed at the central position of the inner chamber of the housing 130, and extends from the second end surface 120 towards the first end surface 100. Optionally, the inner heating layer 11 is substantially perpendicular to the second end surface 120.

In one embodiment of the present disclosure, optionally, in order to ensure that the to-be-evaporated material is effectively heated, a liquid level of the to-be-evaporated material in the crucible body 10 is lower than a top surface 111 of the inner heating layer 11. In other words, the accommodation space 100 is under the top surface 111, and is defined by the space between the inner heating layer 11 and the outer heating layer 12.

In addition, in the inner chamber defined in the housing 130, as shown in FIG. 1, a space is defined between the inner heating layer 11 and the first end surface 110, i.e., a communication passage from the accommodation space 100 to the opening 13, enables the accommodation space 100 to communicate with the opening 13. The communication passage from the accommodation space 100 to the opening 13 serves as a flow path for the to-be-evaporated material that is evaporated in the crucible body 10 to escape from the crucible body through the opening 13.

In one embodiment of the present disclosure, the heater assembly of the outer heating layer 12 includes a first heater and a second heater separated from the first heater. The first heater and the second heater are arranged sequentially in a direction from the second end surface 120 to the first end surface 110. In other words, when the crucible body 10 is vertically disposed, the first heater and the second heater are arranged sequentially in a direction from bottom to up. Specifically, each of the first heater and the second heater is a heating wire that is wound around the inner heating layer 11 with the inner heating layer 11 as a center. Each of the first heater and the second heater is connected with a heating source, respectively, so that different heating sources control the first heater and the second heater to heat, respectively. In other words, the first heater and the second heater are independently controlled.

Referring to FIG. 1, in one embodiment of the present disclosure, the inner heating layer 11 includes a cylindrical heater 115 therein. The heater 115 is connected with a heating source. The heater 115 may be an integral structure that is connected one heating source, or the heater 115 may include several separate components that are connected with one heating source so that the whole heater 115 can be heated simultaneously.

It can be understood that connection wires may extend in the housing of the crucible body 10 and connect the heater with the heating source, thereby realizing an electrical connection between the heater 115 and the heating source.

When performing a vacuum evaporation process with the above crucible, the process of heating the to-be-evaporated material in the accommodation space 100 of the crucible body 10 is as follows.

First, the first heater within the outer heating layer 12 is heated by the heating source. When a temperature of the first heater rises, the housing 130 of the crucible body 10 is preheated.

When a preheating temperature of the crucible body 10 reaches a set temperature, the first heater and the second heater within the outer heating layer 12 are simultaneously heated by the heating source, thereby enabling the temperature of the housing 130 of the crucible body 10 to be further increased and evaporating the to-be-evaporated material within the housing 130.

As reduction of the to-be-evaporated material in the crucible body 10, in the later stage of the vacuum evaporation process, at the same time that both of the first heater and the second heater in the outer heating layer 12 are heated by the heating source, the heater 115 is heated by the heating source to increase a temperature of the inner heating layer 11, thereby increasing a heating area of the to-be-evaporated material. At this point, the heating area of the to-be-evaporated material includes a portion in contact with the outer heating layer 12 and a portion in contact with the inner heating layer 11.

Since there is a large contact area between the to-be-evaporated material and the outer heating layer 12 in an early stage of the vacuum evaporation process, the to-be-evaporated material can be evaporated at a preset target rate when the heater 115 in the inner heating layer 11 does not work. In the later stage of the vacuum evaporation process, although the contact area between the to-be-evaporated material and the outer heating layer 12 is reduced as reduction of the to-be-evaporated material in the crucible body 10 when comparing with the early stage of the vacuum evaporation process, the inner heating layer 11 works to heat the to-be-evaporated material, thereby enabling the entire heating area of the to-be-evaporated material in the later stage of the vacuum evaporation process to be substantially equal to the heating area of the to-be-evaporated material in the early stage of the vacuum evaporation process. Thus, the to-be-evaporated material can be evaporated stably at the preset target rate.

Therefore, when performing the vacuum evaporation process with the above crucible, in case that the to-be-evaporated material is reduced, the to-be-evaporated material can be evaporated stably at the preset target rate without adjusting heating power, thereby avoiding the problem in the related art that the properties of the evaporation material are changed due to the increased heating power.

Figure 2:
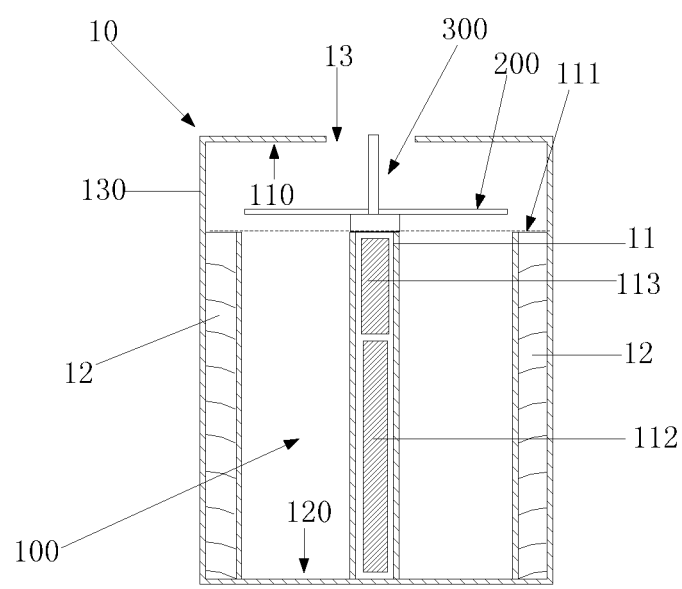
FIG. 2 is a schematic cross-sectional view showing one state of a crucible according to another exemplary embodiment of the present disclosure.
Figure 3:
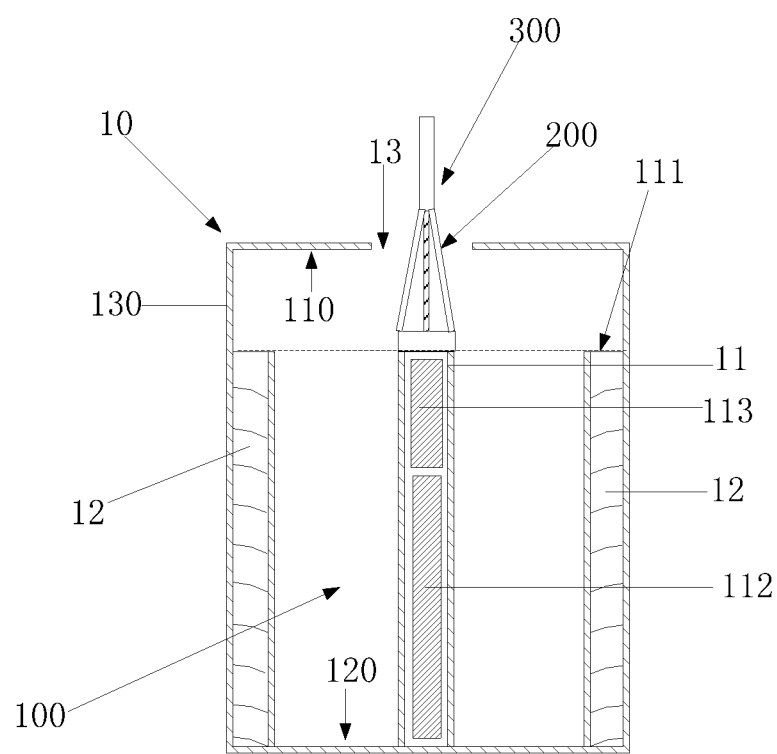
FIG. 3 is a schematic cross-sectional view showing another state of the crucible according to another exemplary embodiment of the present disclosure.

FIG. 2 is a schematic cross-sectional view showing one state of a crucible according to another exemplary embodiment of the present disclosure. FIG. 3 is a schematic cross-sectional view showing another state of the crucible according to another exemplary embodiment of the present disclosure. Similar to the above embodiment, in this embodiment, the crucible body 10 also includes a housing 130 defining an inner chamber, an inner heating layer 11 disposed at a central position of the inner chamber, an outer heating layer mounted to the housing 130 and surrounding the inner heating layer 11. The inner chamber of the housing 130 and a space between the inner heating layer 11 and the outer heating layer 12 define an accommodation space 100 for accommodating a to-be-evaporated material.

Specifically, an opening 13 is defined in a first end surface 110 of the housing 130 and in communication with the accommodation space 100. When the to-be-evaporated material is evaporated, the evaporated material escapes from the crucible body 10 through the opening 13. Within the housing 130, the inner heating layer 11 extends from a second end surface 120 opposite to the first end surface 110 towards the first end surface 110 with a preset distance defined between the first end surface 110 and an end of the inner heating layer 11 away from the second end surface 120. Based on this, the inner heating layer 11 is disposed at the central position of the inner chamber of the housing 130, and extends from the second end surface 120 towards the first end surface 100. Optionally, the inner heating layer 11 is substantially perpendicular to the second end surface 120.

In one embodiment of the present disclosure, optionally, in order to ensure that the to-be-evaporated material is effectively heated, a liquid level of the to-be-evaporated material in the crucible body 10 is lower than a top surface 111 of the inner heating layer 11. In other words, the accommodation space 100 is under the top surface 111, and is defined by the space between the inner heating layer 11 and the outer heating layer 12.

In addition, in the inner chamber defined in the housing 130, as shown in FIG. 2, a space is defined between the inner heating layer 11 and the first end surface 110, i.e., a communication passage from the accommodation space 100 to the opening 13, enables the accommodation space 100 to communicate with the opening 13. The communication passage from the accommodation space 100 to the opening 13 serves as an airflow path for the to-be-evaporated material that is evaporated in the crucible body 10 to escape from the crucible body through the opening 13.

Figure 7:
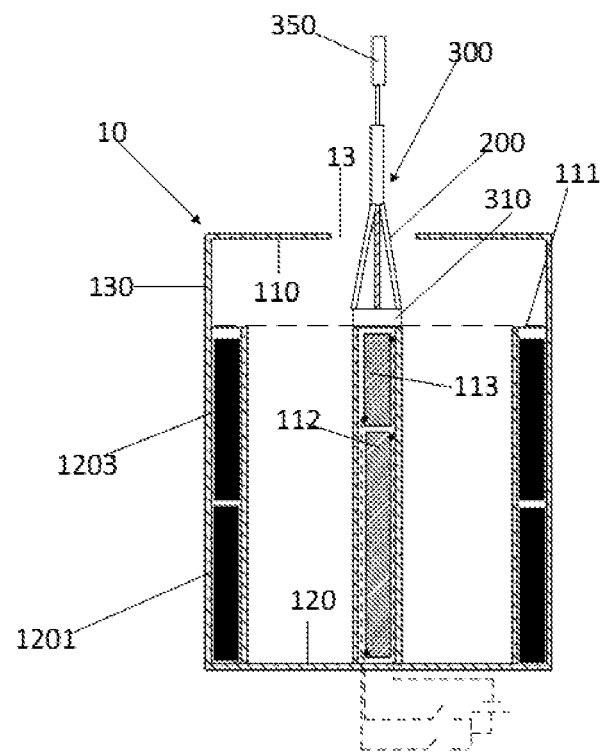
FIG. 7 is a schematic cross-sectional view showing one state of a crucible according to another exemplary embodiment of the present disclosure.

In the embodiment shown in FIG. 2 and FIG. 3, the heater assembly of the outer heating layer 12 includes a first heater 1201 (as shown in FIG. 7) and a second heater 1203 (as shown in FIG. 7) separated from the first heater 1201. The first heater 1201 and the second heater 1203 are arranged sequentially in a direction from the second end surface 120 to the first end surface 110. In other words, when the crucible body 10 is vertically disposed, the first heater 1201 and the second heater 1203 are arranged sequentially in a direction from bottom to up. Specifically, each of the first heater 1201 and the second heater 1203 is a heating wire that is wound around the inner heating layer 11 with the inner heating layer 11 as a center. Each of the first heater 1201 and the second heater 1203 is connected with a heating source, respectively, so that different heating sources control the first heater 1201 and the second heater 1203 to heat, respectively.

In the embodiment shown in FIG. 2 and FIG. 3, the heater assembly of the inner heating layer 11 includes a third heater 112 and a fourth heater 113 separated from the third heater 112. The third heater 112 and the fourth heater 113 are arranged sequentially in a direction from the second end surface 120 to the first end surface 110. In other words, when the crucible body 10 is vertically disposed, the fourth heater 113 and the third heater 112 are arranged sequentially in a direction from bottom to up. Specifically, each of the third heater 112 and the fourth heater 113 has a cylindrical shape and is connected with a heating source, respectively, so that different heating sources control the third heater 112 and the fourth heater 113 to heat, respectively.

It can be understood that connection wires (as shown in FIG. 7) may extend in the housing of the crucible body 10 and connect each of the third heater 112 and the fourth heater 113 with the heating source. Of course, one of ordinary skill in the art may use other methods for connecting each of the third heater 112 and the fourth heater 113 in the inner heating layer 11 with the heating source.

Further, in the embodiment shown in FIG. 2 to FIG. 6, the crucible further includes a guide cover 200 and a linkage structure 300.

The guide cover 200 includes several blades 210. The guide cover 200 has a first state and a second state. FIG. 3 shows the first state of the guide cover 200. At the first state, the blades 210 are folded and stacked in the space between the inner heating layer 11 and the first end surface 110, i.e., the blades 210 are folded and stacked in the airflow path between the accommodation space 100 and the opening 13. FIG. 2 shows the second state of the guide cover 200. At the second state, the blades 210 are unfolded within the crucible body and blocks a part of the airflow path.

The linkage structure 300 is connected with the guide cover 200. The linkage structure 300 enable the guide cover 200 to switch between the first state and the second state.

Specifically, in the embodiment shown in FIG. 2 to FIG. 6, the linkage structure 300 includes a blade seat 310, a shaft 320, a shaft sleeve 330 and a driving member 350.

The blade seat 310 is disposed between the inner heating layer 11 and the first end surface 110, and is mounted to the inner heating layer 11. Optionally, in order to not block the airflow path for the evaporated material from the accommodation space 100 to the opening 13, a projection of the blade seat 310 to the top surface of the inner heating layer 11 overlaps the inner heating layer 11 and is within the top surface of the inner heating layer 11.

The shaft 320 is fixed to the blade seat 310, and extends towards the first end surface 110. Optionally, the shaft 320 is perpendicularly disposed on the blade seat 310.

The shaft sleeve 330 is disposed around the shaft 320, and is capable of moving relative to the shaft 320 in a direction towards or away from the first end surface 110. The shaft sleeve 330 is connected with each blade 210. The blades 210 are driven by the shaft sleeve 330 to move in a direction towards or away from the first end surface 110, thereby enabling the guide cover 200 to switch between the first state and the second state.

The driving member 350 (as shown in FIG. 7) is connected with the shaft sleeve 330. The driving member 350 drives the shaft sleeve 330 to move relative to the shaft 320 in the direction towards or away from the first end surface 110.

Figure 4:
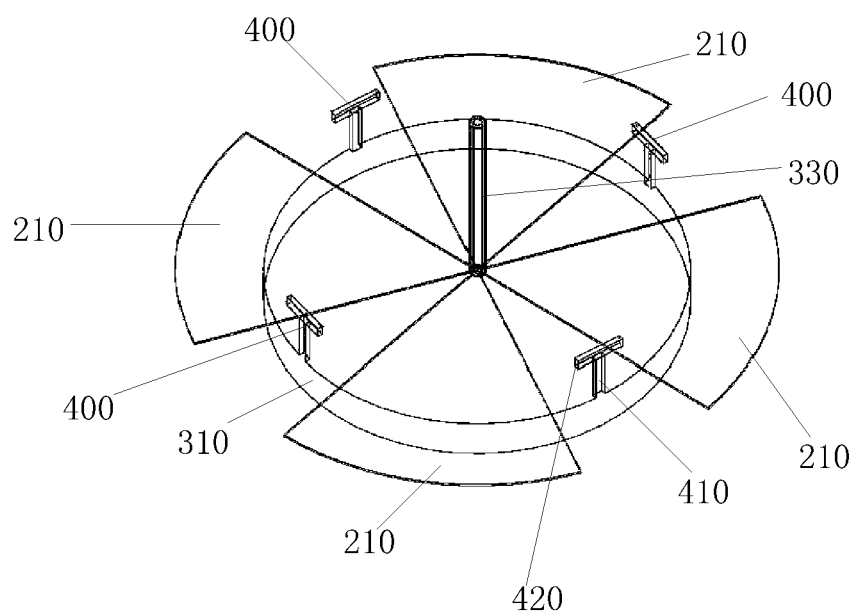
FIG. 4 is a perspective view showing one state of a guide cover and a linkage structure of the crucible according to another exemplary embodiment of the present disclosure.
Figure 5:
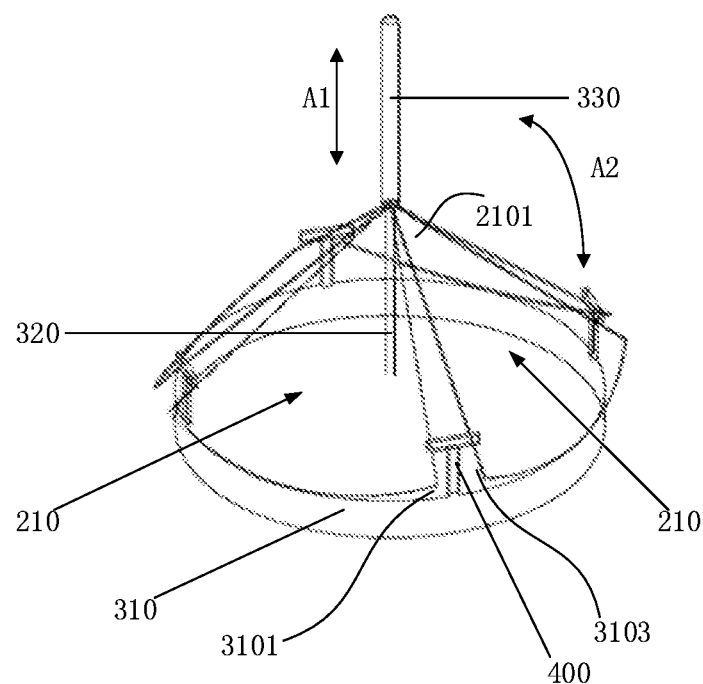
FIG. 5 is a perspective view showing another state of the guide cover and the linkage structure of the crucible according to another exemplary embodiment of the present disclosure.
Figure 6:
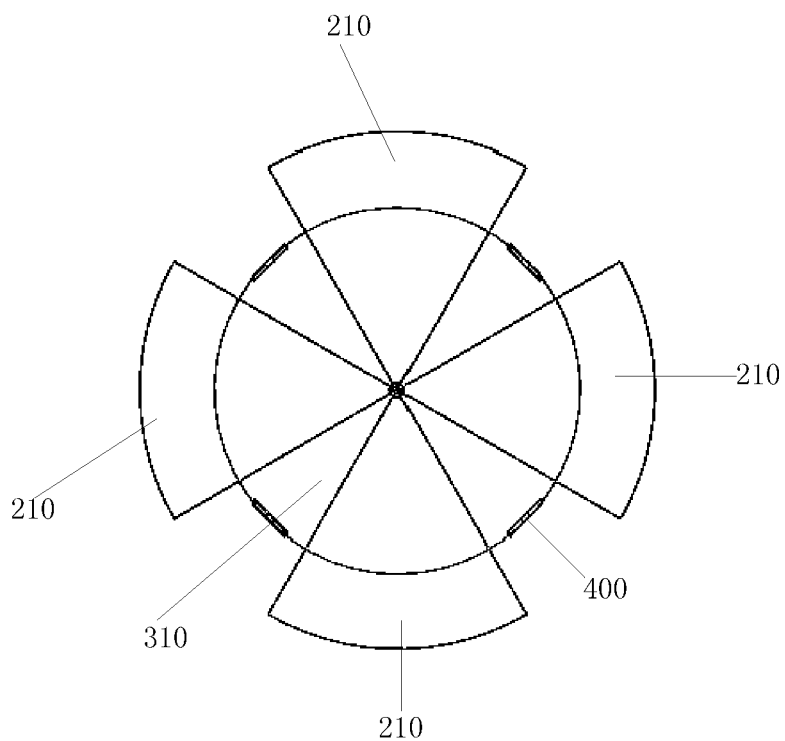
FIG. 6 is a top view of the guide cover and the linkage structure shown in FIG. 4.

Specifically, in the embodiment shown in FIG. 4 to FIG. 6, each blade 210 is fan-shaped, and has an end 2101 of a smaller width. The end 2101 is connected with the shaft sleeve 330 via a pivot. The present of the pivot enables the blade to rotate relative to the shaft sleeve 330. In other words, when the blade 210 slides along with the shaft sleeve 330 relative to the shaft 320 in a direction indicated by an arrow A1 shown in FIG. 5, the blade 210 rotates relative to the shaft sleeve 330 in a direction indicated by an arrow A2 shown in FIG. 5. Based on the above structure, when the shaft sleeves 330 moves downward relative to the shaft 320 to the lowest position, the several blades 210 are in an unfolded state (i.e., the second state) shown in FIG. 4. The unfolded blades 210 are in an identical plane with an interval defined between adjacent blades. Optionally, when the several blades 210 are in the unfolded state, each blade 210 is attached to the blade seat 310. When the shaft sleeve 330 moves upwardly relative to the shaft 320, the shaft sleeve 330 brings ends of the blades 210 connected with the shaft sleeve 330 to move upwards. As shown in FIG. 5, the blades 210 are folded and stacked in the space above the blade seat 310, and are at the first state. When the blades 210 are at the first state, a projection of the blades 210 to a top surface of the blade seat 310 is within the top surface of the blade seat 310. Since a coverage range of the blade seat 310 at the inner heating layer 11 is within the top surface of the inner heating layer 11, the blades 210 at the first state are also within the top surface of the inner heating layer 11, thereby not blocking the airflow passage around the blade seat 310.

In the embodiment shown in FIG. 4 and FIG. 5, optionally, the blade seat 310 is cylindrical, and there are several spaced blocking bars 400 disposed on the top surface 301 of the blade seat 310 around a circumferential direction of the blade seat 310. When the several blades 210 are unfolded at the top surface of the blade seat 310, each blocking bar 400 is disposed adjacent two blades 210 and there is one blocking bar 400 between every two adjacent blades. An inserting space 3103 is defined between the blocking bars 400 and the blade seat 310. When the guide cover 200 switches between the first state and the second state, each blade 210 is inserted into the inserting space 3103.

Specifically, each blocking bar 400 includes a first portion 410 connected with the blade seat 310, and a second portion 420 connected with the first portion 410. The second portion 420 extends from the first portion 410 in directions towards the blades 210 at two sides of the first portion 410. The inserting space 3103 is defined between the second portion 420 and the top surface of the blade seat 310. Each blade 210 is inserted into the inserting space. When switching between the first state and the second state, the blade 210 is restricted within the inserting space. The blocking bar 400 can block the blade 210 from escaping therefrom.

In the embodiment shown in FIG. 5, the blocking bar 400 is substantially T-shaped. Of course, in other embodiments, the second portions 420 of the several blocking bars 400 may be connected together to form a ring with an inserting space defined between the ring and the top surface of the blade seat 310. Thus, structures of the blocking bar are not limited to those shown in FIG. 4 to FIG. 6.

In addition, in the embodiment shown in FIG. 2 to FIG. 6, the driving member 350 for driving the shaft sleeve 330 to move relative to the shaft 320 may be a pneumatic driver or a hydraulic driver.

In one embodiment, the driving member may be connected to a cover of the crucible, and may extend through the cover to drive the shaft sleeve.

In the embodiment shown in FIG. 2 to FIG. 6, the guide cover is disposed within the crucible body; when the guide cover 200 is at the first state, the blades 210 are folded and stacked above the inner heating layer 11 in the airflow path between the accommodation space 100 and the opening 13. When the guide cover 200 is at the second state, the blades 210 are unfolded in a plane within the crucible, spaced from each other and block a part of the airflow passage, thereby enabling the evaporated material between the accommodation space 100 and the opening 13 to be uniformly distributed.

Figure 8:
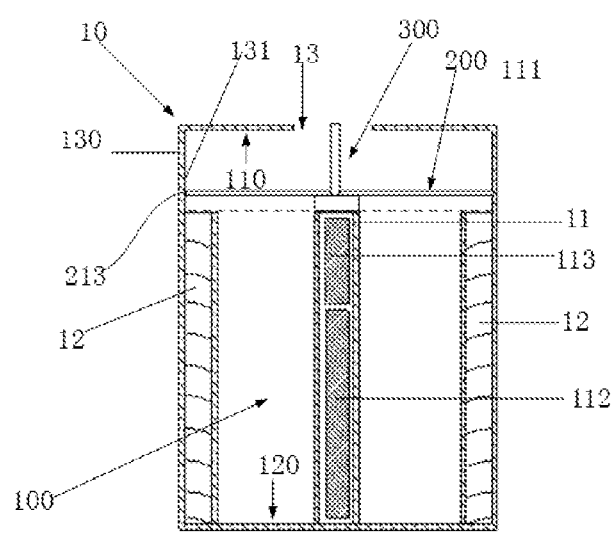
FIG. 8 is a schematic cross-sectional view showing one state of a crucible according to another exemplary embodiment of the present disclosure.

Optionally, as shown in FIG. 8, when the guide cover 200 is at the second state, an outer periphery of each blade at the unfolded state abuts against the inner wall 131 of the housing 130.

When performing a vacuum evaporation process with the above crucible shown in FIG. 2 to FIG. 6, the process of heating the to-be-evaporated material in the accommodation space 100 of the crucible body 10 is as follows.

First, the first heater within the outer heating layer 12 is heated by the heating source. When a temperature of the first heater rises, the crucible body 10 is preheated.

When a preheating temperature of the crucible body 10 reaches a set temperature, the first heater and the second heater within the outer heating layer 12 are simultaneously heated by the heating source, thereby enabling the temperature of the housing 130 of the crucible body 10 to be further increased and evaporating the to-be-evaporated material within the housing 130. Meanwhile, the fourth heater 113 is heated by the heating source, thereby enabling the fourth heater 113 to heat the guide cover 200 and the linkage structure 300 that are connected with the inner heating layer 11 and then preventing the temperature of the evaporated material from being reduced due to the presence of the guide cover 200 and the linkage structure 300. At this point, since a temperature of a portion of the to-be-evaporated material in contact with the outer heating layer 12 is greater than a temperature of a central portion of the to-be-evaporated material in contact with the inner heating layer 11, the evaporated material flows from an inner edge of the housing 130 towards the opening 13. Since the portion of the to-be-evaporated material in contact with the outer heating layer 12 is heated uniformly, the evaporated material is uniformly distributed and then the guide cover 200 is at the first state.

As reduction of the to-be-evaporated material in the crucible body 10, in the later stage of the vacuum evaporation process, at the same time that both of the first heater and the second heater in the outer heating layer 12 are heated by the heating source, the third heater 112 and the fourth heater 113 are heated by the heating source to increase a temperature of the inner heating layer 11, thereby increasing a heating area of the to-be-evaporated material. At this point, the heating area of the to-be-evaporated material includes the portion in contact with the outer heating layer 12 and a portion in contact with the inner heating layer 11.

Since there is a large contact area between the to-be-evaporated material and the outer heating layer 12 in an early stage of the vacuum evaporation process, the to-be-evaporated material can be evaporated at a preset target rate when the third heater 112 in the inner heating layer 11 does not work. In the later stage of the vacuum evaporation process, although the contact area between the to-be-evaporated material and the outer heating layer 12 is reduced as reduction of the to-be-evaporated material in the crucible body 10 when comparing with the early stage of the vacuum evaporation process, the inner heating layer 11 works to heat the to-be-evaporated material, thereby enabling the entire heating area of the to-be-evaporated material in the later stage of the vacuum evaporation process to be substantially equal to the heating area of the to-be-evaporated material in the early stage of the vacuum evaporation process. Thus, the to-be-evaporated material can be evaporated stably at the preset target rate.

In addition, in the later stage of the vacuum evaporation process, the to-be-evaporated material has one portion in contact with the outer heating layer 12 and another portion in contact with the inner heating layer 11. The material in these two portions of the to-be-evaporated material is evaporated to form two evaporated airflows. But the material in these two portions of the to-be-evaporated material is evaporated at different evaporation rates, and then the guide cover 200 is switched to the second date to enable the evaporated airflows that pass through the guide cover 200 to be uniformly distributed.

In one embodiment of the present disclosure, the inner heating layer 11 is connected with the blade seat of the linkage structure 300, and the blade seat 310 is heated by the inner heating layer 11, thereby heating both of the guide cover 200 and the linkage structure 300. Of course, in order to use the inner heating layer 11 to heat the guide cover 200 and the linkage structure 300, the inner heating layer 11 is not limited to be connected with the blade seat 310, for example, the shaft 320 of the linkage structure 300 may extend downwardly through the blade seat 310 into the inner heating layer 11, thereby heating the guide cover 200 and the linkage structure 300.

Based on the above structures, when performing the vacuum evaporation process with the above crucible shown in FIG. 2 to FIG. 6, in case that the to-be-evaporated material is reduced, the to-be-evaporated material can be evaporated stably at the preset target rate without adjusting heating power, thereby avoiding the problem in the related art that the properties of the evaporation material are changed due to the increased heating power. Further, the presence of the guide cover enables the evaporated material ejected from the crucible to be more uniform, thereby obtaining a film layer that is uniformly deposited.

One embodiment of the present disclosure further provides an evaporation source which includes above crucible.

Further, one embodiment of the present disclosure further provides an evaporation device which includes the above evaporation source.

Based on the above description of the crucible, one of ordinary skill in the art would understand structures of the evaporation source including the crucible and the evaporation device, which will be not elaborated herein.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A crucible, comprising:
   a crucible body, wherein the crucible body includes:
      an inner heating layer with a first heater assembly; and
      an outer heating layer with a second heater assembly;
   wherein the outer heating layer is at a periphery of the inner heating layer and surrounds the inner heating layer, and a space between the outer heating layer and the inner heating layer defines an accommodation space for a to-be-evaporated material,
   the crucible body includes an opening in a first end surface of the crucible body for evaporated material of the to-be-evaporated material to escape from the crucible body;
   the inner heating layer extends from a second end surface opposite to the first end surface towards the first end surface; and
   an end of the inner heating layer away from the second end surface is spaced from the first end surface,
   the crucible further comprises a guide cover and a linkage structure, wherein:

the guide cover includes several blades;

the guide cover has a first state and a second state, wherein in the first state, the blades are folded and stacked in a space between the inner heating layer and the first end surface, and an airflow path is defined between the accommodation space and the opening, and in the second state, the blades are unfolded within the crucible body and blocks a part of the airflow path; and the linkage structure is connected with the guide cover, and is configured to drive the guide cover to switch between the first state and the second state.

2. The crucible of claim 1, wherein:

the crucible body further includes a housing having an inner chamber;

the outer heating layer is connected with the housing; and the inner heating layer is at a central position of the inner chamber.

3. The crucible of claim 2, wherein the outer heating layer is in the inner chamber, mounted to an inner wall of the housing, and surrounds the inner heating layer.

4. The crucible of claim 1, wherein the second heater assembly of the outer heating layer includes a first heater and a second heater spaced from the first heater, the first heater and the second heater being arranged sequentially in a direction from the second end surface to the first end surface.

5. The crucible of claim 4, wherein each of the first heater and the second heater is a heating wire that is wound around the inner heating layer with the inner heating layer as a center.

6. The crucible of claim 4, wherein the first heater and the second heater are independently controlled.

7. The crucible of claim 4, wherein the first heater assembly of the inner heating layer includes a third heater and a fourth heater separated from the third heater, the third heater and the fourth heater being arranged sequentially in a direction from the second end surface to the first end surface.

8. The crucible of claim 7, wherein each of the third heater and the fourth heater has a cylindrical shape.

9. The crucible of claim 7, wherein the third heater and the fourth heater are independently controlled.

10. The crucible of claim 1, wherein the unfolded blades are in an identical plane within the crucible body with an interval defined between adjacent blades.

11. The crucible of claim 1, wherein an outer periphery of each blade at the unfolded state abuts against an inner wall of the housing of the crucible body.

12. The crucible of claim 1, wherein the linkage structure includes:

a blade seat between the inner heating layer and the first end surface;

a shaft fixed to the blade seat and extending towards the first end surface;

a shaft sleeve disposed around the shaft and movable relative to the shaft in a direction towards or away from the first end surface, wherein the shaft sleeve is connected with each blade, and the blades are driven by the shaft sleeve to move in a direction towards or away from the first end surface, thereby enabling the guide cover to switch between the first state and the second state; and a driving member connected with the shaft sleeve;

wherein the driving member drives the shaft sleeve to move relative to the shaft in the direction towards or away from the first end surface.

13. The crucible of claim 12, wherein the blade seat is on an end of the inner heating layer away from the second end surface.

14. The crucible of claim 12, wherein each blade is pivotally connected to the shaft sleeve.

15. The crucible of claim 12, wherein the driving member includes a pneumatic driver or a hydraulic driver.

16. The crucible of claim 12, wherein the linkage structure further includes a blocking bar on the blade seat with an inserting space defined between the blocking bars and the blade seat; and wherein each blade is inserted into the inserting space when the guide cover switches between the first state and the second state.

17. An evaporation source, comprising the crucible of claim 1.

18. An evaporation device, comprising the evaporation source of claim 17.

* * * * *